(12) United States Patent
Berte

(10) Patent No.: US 8,912,493 B2
(45) Date of Patent: Dec. 16, 2014

(54) HIGH RESOLUTION THERMOGRAPHY

(75) Inventor: Marc V. Berte, Ashburn, VA (US)

(73) Assignee: Raytheon Company, Waltham, MA (US)

( * ) Notice: Subject to any disclaimer, the term of this patent is extended or adjusted under 35 U.S.C. 154(b) by 129 days.

(21) Appl. No.: 13/349,790

(22) Filed: Jan. 13, 2012

(65) Prior Publication Data

US 2013/0181129 A1 Jul. 18, 2013

(51) Int. Cl.
*G01J 5/02* (2006.01)
*H01L 27/146* (2006.01)
*G01J 5/00* (2006.01)

(52) U.S. Cl.
CPC ....... *H01L 27/146* (2013.01); *G01J 2005/0077* (2013.01)
USPC ....................................................... 250/332

(58) Field of Classification Search
CPC ... G01J 2005/0077; G01J 5/02; H01L 27/146
USPC ....................................................... 250/332
See application file for complete search history.

(56) References Cited

U.S. PATENT DOCUMENTS

| | | | |
|---|---|---|---|
| 3,963,926 A | 6/1976 | Borrello | |
| 4,576,679 A | 3/1986 | White | |
| 4,675,525 A * | 6/1987 | Amingual et al. | 250/338.1 |
| 5,633,972 A | 5/1997 | Walt et al. | |
| 5,966,424 A | 10/1999 | Liu | |
| 6,052,238 A | 4/2000 | Ebbesen et al. | |
| 6,285,811 B1 | 9/2001 | Aggarwal et al. | |
| 6,649,901 B2 | 11/2003 | Thio et al. | |
| 2003/0155510 A1 * | 8/2003 | Dean et al. | 250/332 |
| 2003/0235272 A1 * | 12/2003 | Appleby et al. | 378/147 |
| 2009/0095912 A1 * | 4/2009 | Slinger et al. | 250/363.06 |

FOREIGN PATENT DOCUMENTS

| | | |
|---|---|---|
| JP | 2000509834 A | 8/2000 |
| JP | 2007311515 A | 11/2007 |
| JP | 2008122140 A | 5/2008 |
| JP | 2008171905 A | 7/2008 |
| JP | 2009063411 A | 3/2009 |
| JP | 2010267913 A | 11/2010 |
| WO | 9840710 A1 | 9/1998 |
| WO | 2007088552 A1 | 8/2007 |

OTHER PUBLICATIONS

Partial European Search Report; Application No. EP 13 15 0732; Dated; Apr. 22, 2013; pp. 1-5.
Extended European Search Report; Application No. EP 13 15 0732; Date Mailed: Jul. 5, 2013, pp. 1-10.
A.D. Trigg, "The Infrared Photoemission Microscope as a Tool for Semiconductor Device Failure Analysis," Institute of Microelectronics, Singapore, Proceedings of the 6th IPFA, IEEE, Jul. 1997, pp. 1-6.

* cited by examiner

*Primary Examiner* — Marcus Taningco
(74) *Attorney, Agent, or Firm* — Cantor Colburn LLP

(57) ABSTRACT

A thermographic imaging device includes a focal array portion including a planar arrangement of a plurality of light sensitive devices, and an aperture portion including a facing planar surface, an opposing planar surface, and an arrangement of a plurality of orifices that are communicative with the facing planar surface and the opposing planar surface, each infrared sensitive device of the plurality of infrared arranged in alignment with a corresponding orifice of the plurality of orifices.

19 Claims, 3 Drawing Sheets

HIGH RESOLUTION THERMOGRAPHY

BACKGROUND

The present invention relates to temperature sensing, and more specifically, to sensing high resolution thermography.

Thermography often uses infrared detectors to sense a temperature of a surface of an object. The infrared detectors detect the amount of infrared photons that are emitted by the surface, and through processing, the corresponding temperature of the surface may be determined. The resultant temperature data may be output to a user as temperature data values or a thermal image with different temperatures represented by different colors on the image.

BRIEF SUMMARY

According to one embodiment of the present invention, a thermographic imaging device includes a focal array portion including a planar arrangement of a plurality of light sensitive devices, and an aperture portion including a facing planar surface, an opposing planar surface, and an arrangement of a plurality of orifices that are communicative with the facing planar surface and the opposing planar surface, each infrared sensitive device of the plurality of infrared arranged in alignment with a corresponding orifice of the plurality of orifices.

According to another embodiment of the present invention, a thermographic imaging system includes a thermographic imaging device having a focal array portion including a planar arrangement of a plurality of light sensitive devices, and an aperture portion including a facing planar surface, an opposing planar surface, and an arrangement of a plurality of orifices that are communicative with the facing planar surface and the opposing planar surface, each infrared sensitive device of the plurality of infrared arranged in alignment with a corresponding orifice of the plurality of orifices, and a controller communicatively connected to the focal array portion, the controller operative to receive signals from the plurality of light sensitive devices.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

The use of thermography to detect temperatures at a high resolution on small objects presents challenges when the resolution desired is less than the wavelengths of the infrared (IR) light emitted by the object's surface. For example, semiconductor devices include features such as transistors, capacitors, resistors, and inductors that may be scaled to sizes that are less than the IR emitted by the features. The use of traditional thermal imaging systems typically does not allow the individual temperatures of such small features to be measured since the resolution of the systems is often limited to approximately the IR wavelengths emitted by the surface features of interest.

Figure 1:
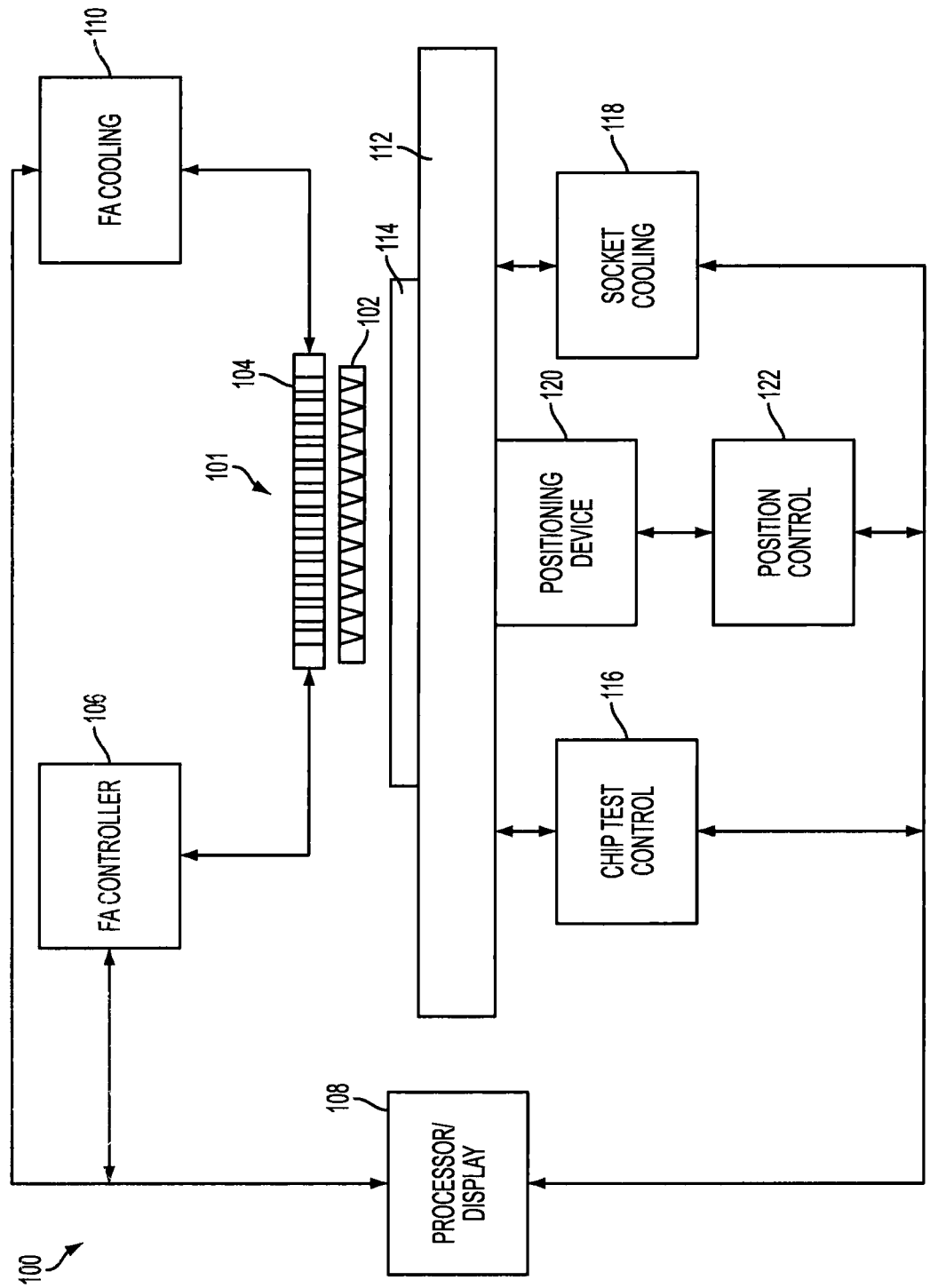
FIG. 1 illustrates a block diagram of an exemplary embodiment of a thermography system.

FIG. 1 illustrates a block diagram of an exemplary embodiment of a thermography system 100. The system 100 includes an imaging device 101 that includes a near field aperture array (NFAA) portion 102 and a focal plane detector array 104 (each described in further detail below). The focal array 104 includes a planar array of a plurality of electromagnetic (e.g., IR) sensitive devices such as, for example, IR sensitive pixels that are operative to convert IR photons into electrons. The NFAA portion 102 includes a plurality of orifices that correspond to each of the IR sensitive devices. The focal array 104 is communicatively connected to a focal array controller portion 106 that is operative to receive the electrons output by the focal array 104. The focal array controller portion 106 may be communicatively connected to a processor and/or display device 108 that is operative to receive data from the focal array 104 controller and output the data to the display device 108. The focal array 104 may be connected to a focal array cooler portion 110 that is operative to cool the focal array 104.

In the illustrated embodiment, the system 100 includes a test socket 112 that is operative to secure a semiconductor device or chip 114 in a desired position by, for example, engaging pins of the chip with conductive contacts. The conductive contacts of the chip test socket (socket) 112 are communicatively connected to a chip test control portion 116 that is operative to provide power to the chip 114, and send and receive test signals to and from the pins of the chip 114. A socket cooling portion 118 is connected to the socket 112, and is operative to cool the back surface of the chip 114 to a predetermined constant temperature. The chip test socket 112 is arranged on a positioning device 120 that may include, for example, a hexapod positioning system that is controlled by a position controller 122.

The chip test socket 112 is merely provided to allow testing of the chip 114. For example, the temperature of features of the chip 114 may be determined during the operation of the chip 114 as the chip test control portion 118 sends signals to the chip 114 that should result in features of the chip increasing or decreasing in temperature. The sensed temperatures of the features may be presented to a user in a thermographic image or as a set of data displayed on the display 108. Though the illustrated embodiment of the system 100 includes the chip test socket 112, alternate embodiments need not include the chip test socket 112, and may be used to measure the temperature of any type of planar surface arranged proximate to the NFAA portion 102.

Figure 2:
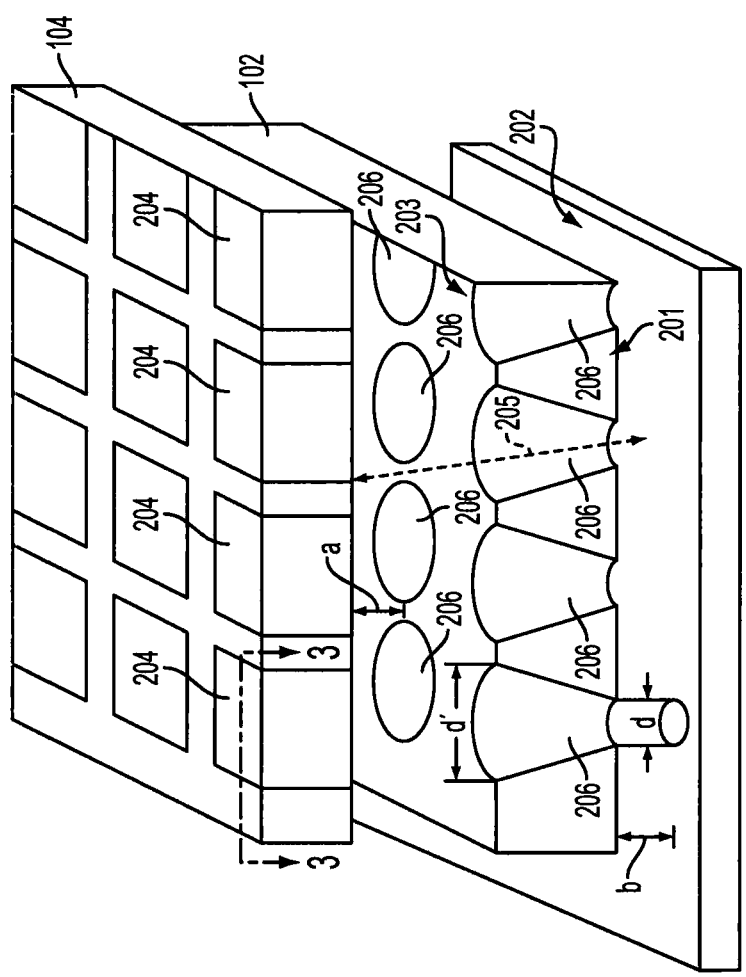
FIG. 2 illustrates a perspective view of a portion of thermography system.

FIG. 2 illustrates a perspective view of a portion of the NFAA portion 102 and focal array 104 arranged proximate to a test surface 202 (i.e., a surface of interest on the chip under test). The focal array 104 includes a plurality of IR sensitive devices (pixels) 204 that convert impinging photons into electrons and output the electrons. The illustrated embodiment may include IR sensitive devices 204 that are single-band or multi-band. The use of multi-band IR sensitive devices 204 improves temperature determination. The amount of electrons output by each of the IR sensitive devices 204 is indicative of the amount of IR photons impinging on each of the IR sensitive devices 204. The amount of IR photons impinging on each of the IR sensitive devices 204 is indicative of the test surface emissivity and temperatures sensed by each of the IR sensitive devices 204. The NFAA portion 102 includes an array of orifices 206. Each orifice 206 corresponds to an IR sensitive device 204 of the focal array 104. The orifices 206 are substantially frusticonically shaped and are communicative with a facing planar surface 201 and an opposing planar surface 203. Though the illustrated embodiment describes substantially frusticonically shaped orifices 206, the orifices 206 are not limited to such a shape, and may include any shape such as for example, substantially rectangular, oblong, elliptical or any other geometric shape. Though the sides of the orifices 206 are sloped, the sides in alternate embodiments may be arranged in parallel (i.e., having a generatrix that is substantially perpendicular to the facing planar surface 201 as opposed to a generatrix that is arranged an oblique angle relative to the facing planar surface 201 as illustrated), or may have sides substantially defined by a generatrix having a parabolic, curved or sloped shape. The facing planar surface 201 is substantially parallel with the opposing planar surface 203. The facing planar surface 201 is arranged proximal to the test surface 202, while the opposing planar surface 203 is arranged proximal to the focal array 104. The facing planar surface 201 defines a portion of the orifices 206 having a substantially circular profile defining a first diameter (d) while the opposing planar surface defines a portion of the orifices having a substantially circular profile defining a second diameter (d') where d'>d. In the illustrated embodiment each IR sensitive device 204 is arranged with a corresponding orifice 206 such that a central or longitudinal axis 205 of the orifice 206 defined by points substantially defined by the center points of the first diameter and the second diameter is aligned with, and substantially normal to, a portion of the IR sensitive device 204. The opposing planar surface 203 of the NFAA portion 102 is arranged a distance (a) and substantially in parallel to the focal array 104, while the facing planar surface 201 is arranged a distance b and substantially in parallel to the test surface 202.

Figure 3:
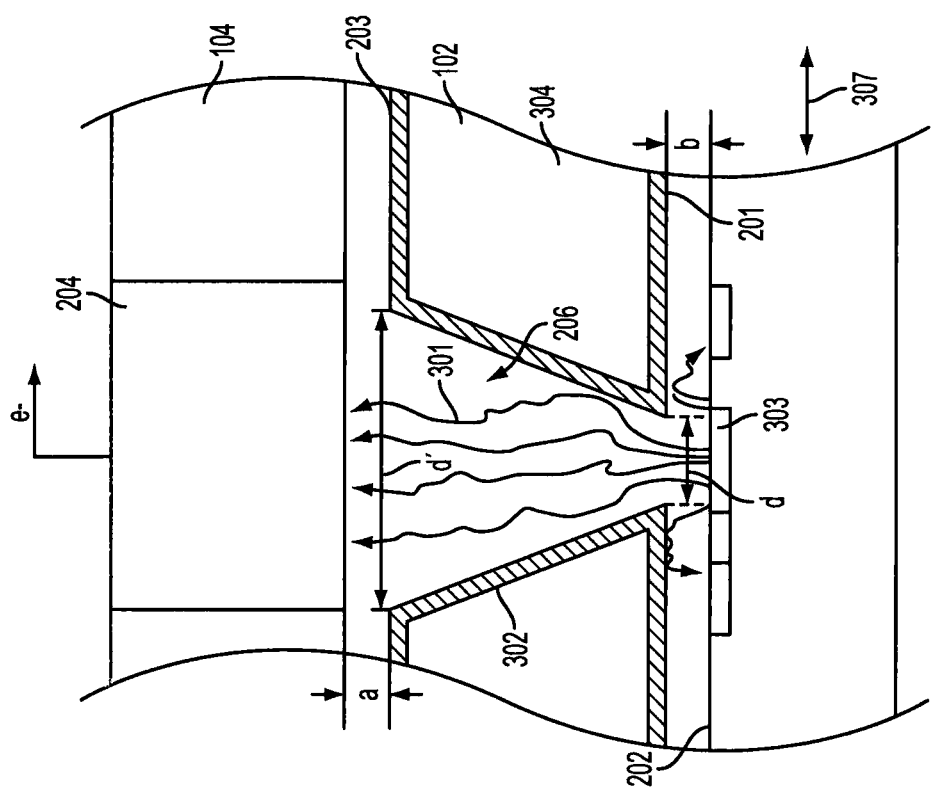
FIG. 3 illustrates a side cut-away view along the line 3 of FIG. 2.

FIG. 3 illustrates a side cut-away view along the line 3 (of FIG. 2). The NFAA portion 102 is coated with a reflective material 302 such as, for example, gold that is operative to reflect IR photons 301 that are emitted by a feature 303 arranged on the test surface 202 and transmitted via near-field optical phenomenon through the orifice (206) aperture of size d on the surface 201, and to prevent transmission of the IR photons through the material composing the NFAA. The NFAA portion 102 may be fabricated from a wafer substrate material 304 that includes, for example, silicon or germanium materials. The orifices 206 may be fabricated using, for example, a lithographic patterning and etching process. Following the etching process, the reflective material 302 may be disposed on exposed surfaces of the material 304 using for example, a chemical and/or vapor deposition process.

As discussed above, for very small features, the wavelength of the IR waves may be too large for sufficient resolution to detect the IR photons 301 emitted from particular very small features. The dimension d of the orifices 206 is selected to increase the resolution of the system 100. In this regard, in the illustrated exemplary embodiment, d is approximately 0.2 µm to 0.5 µm while the wavelengths (λ) of the IR photons 301 emitted from the features on the test surface 202 are approximately 4 µm. The dimensions a and b are approximately 1 µm while the dimension (c) of the IR sensitive device 204 is approximately 10 µm to 20 µm. Thus, the dimensions d and b are less than the wavelengths λ of the IR photons 301 emitted from the features on the test surface 202. In operation, the feature of interest 303 emits IR photons 301. Some of the photons pass through the orifice 206 while other photons are reflected by the facing surface 201. The photons 303 that pass through the orifice 206 impinge on the IR sensitive device 204, which outputs electrons corresponding to the impinging IR photons 301. The output from the IR sensitive device 204 is received by the focal array controller portion 106 (of FIG. 1). The focal array controller portion 106 receives signals from each of the IR sensitive devices 204 in the focal array 104 and may either process the signals or output the signals to the processor and display 108, which may generate a thermographic image or a set of data indicative of the sensed temperatures corresponding to the measured IR photons 301.

The relative position of the focal array 104 and FNA portion 102 to the test surface 202 may be adjusted by the positioning device 120. Once the distance b has been substantially set, the test surface 202 may be moved in a direction parallel to the facing surface 201 as indicated by the arrow 307. In this regard, the focal array 104 and the FNA portion 102 may scan the surface 201 by receiving IR photons 301 while the relative position of a portion of the test surface 303 to the focal array 104 and FNA portion 102 is adjusted. The processor 108 may control the movement of the test surface 202 and generate a thermographic image corresponding to the sensed IR photons 301 during the scan. Such a process allows a number of scanned positions to address an area of the test surface 202. Thus, each scan position may be incrementally changed a distance d during the scan to scan a desired region or portion of the test surface 202. A number of scan positions with the relative positions over each scan being less than the distance d may increase the resolution of the resulting data or image. Thus, the smaller incremental distance between each of the scan positions may result in an increase in overall resolution for the resulting data or image.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A thermographic imaging device comprising:
   a focal array portion including a planar arrangement of a plurality of light sensitive devices;
   an aperture portion including a facing planar surface, an opposing planar surface, and an arrangement of a plurality of orifices that are communicative with the facing planar surface and the opposing planar surface, each light sensitive device of the plurality of light sensitive devices arranged in alignment with a corresponding orifice of the plurality of orifices; and
   a support surface disposed proximate to the facing planar surface, the support surface configured to secure an element that emits photons to the plurality of orifices;
   wherein the facing planar surface defines a first diameter of each of the orifices of the plurality of orifices and the opposing planar surface defines a second diameter of each of the orifices of the plurality of orifices, the first diameter being less than the second diameter,
   wherein the facing planar surface is configured to pass the photons through the first diameter, and wherein the second diameter is located proximate to the plurality of light sensitive devices to convey the passing photons thereto.

2. The device of claim 1, wherein the first diameter is a diameter of a substantially circular profile.

3. The device of claim 1, wherein the second diameter is a diameter of a substantially elliptical profile.

4. The device of claim 1, wherein the opposing planar surface is arranged proximate to the focal array portion.

5. The device of claim 1, wherein the plurality of light sensitive devices includes infrared sensitive devices.

6. The device of claim 1, wherein the orifice defines a substantially frusticonical shape.

7. The device of claim 1, wherein a layer of reflective material is disposed in each orifice of the plurality of orifices.

8. The device of claim 1, wherein the opposing planar surface is arranged substantially in parallel to a planar surface of the focal array portion.

9. A thermographic imaging system comprising:
   thermographic imaging device comprising:
   a focal array portion including a planar arrangement of a plurality of light sensitive devices; and
   an aperture portion including a facing planar surface, an opposing planar surface, and an arrangement of a plurality of orifices that are communicative with the facing planar surface and the opposing planar surface, each light sensitive device of the plurality of light sensitive devices arranged in alignment with a corresponding orifice of the plurality of orifices; and
   a controller communicatively connected to the focal array portion, the controller operative to receive signals from the plurality of light sensitive devices,
   a support surface disposed proximate to the facing planar surface, the support surface configured to secure an element that emits photons to the plurality of orifices;
   wherein the facing planar surface defines a first diameter of each of the orifices of the plurality of orifices and the opposing planar surface defines a second diameter of each of the orifices of the plurality of orifices, the first diameter being less than the second diameter,
   wherein the facing planar surface is configured to pass the photons through the first diameter, and wherein the second diameter is located proximate to the plurality of light sensitive devices to convey the passing photons thereto.

10. The system of claim 9, wherein the system further comprises:
    a test socket vertically aligned with the aperture portion, the test socket having a socket portion configured to engage conductive pins of a chip and secure the chip to the test socket such that the plurality of orifices directs photons emitted from the chip to the plurality of light sensitive devices, and
    a chip test controller communicatively connected to the conductive pins of the chip.

11. The system of claim 10, wherein the system further comprises a socket cooling portion operative to control a temperature of a portion of the test socket.

12. The system of claim 9, wherein the system further comprises a processor communicatively connected to the controller, the processor operative to receive signals from the plurality of light sensitive devices and process the signals to output temperature data corresponding to the signals received from the plurality of light sensitive devices.

13. The system of claim 9, wherein the system further comprises a processor communicatively connected to the controller, the processor operative to receive signals from the plurality of light sensitive devices and process the signals to output a thermographic corresponding to the signals received from the plurality of light sensitive devices.

14. The system of claim 9, wherein the system further comprises a positioning device operative to position a test surface in positions relative to the aperture portion.

15. The system of claim 9, wherein the light sensitive devices are infrared sensitive devices.

16. The system of claim 9, wherein the aperture portion is arranged a distance (b) from a test surface that emits photons having wavelengths greater than b.

17. The system of claim 9, wherein the aperture portion is arranged proximate to a test surface that emits photons having wavelengths greater than a dimension defined by each orifice of the plurality of orifices.

18. The system of claim 9, wherein a layer of reflective material is disposed in each orifice of the plurality of orifices.

19. The system of claim 14, wherein the position device adjusts a position of a portion of the test surface relative to the focal array portion and the aperture portion while the focal array portion and the aperture portion receive photons from the test surface such that a resolution of an image based on the received photons is increased.

* * * * *